(12) United States Patent
Cao

(10) Patent No.: US 10,782,571 B2
(45) Date of Patent: Sep. 22, 2020

(54) COA-TYPE ARRAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wu Cao, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 59 days.

(21) Appl. No.: 15/749,293

(22) PCT Filed: Jan. 12, 2018

(86) PCT No.: PCT/CN2018/072512
§ 371 (c)(1),
(2) Date: Jan. 31, 2018

(87) PCT Pub. No.: WO2019/127670
PCT Pub. Date: Jul. 4, 2019

(65) Prior Publication Data
US 2019/0204667 A1  Jul. 4, 2019

(30) Foreign Application Priority Data
Dec. 29, 2017  (CN) .......................... 2017 1 1484164

(51) Int. Cl.
*G02F 1/1343* (2006.01)
*G02F 1/1335* (2006.01)
(Continued)

(52) U.S. Cl.
CPC .. *G02F 1/134309* (2013.01); *G02F 1/133512* (2013.01); *G02F 1/133514* (2013.01);
(Continued)

(58) Field of Classification Search
CPC ......... G02F 1/133514; G02F 1/136286; G02F 1/134309; G02F 1/133512;
(Continued)

(56) References Cited

U.S. PATENT DOCUMENTS

2005/0078257 A1* 4/2005 Lee ................... G02F 1/134363
349/141
2005/0110013 A1* 5/2005 Zhong ............... G02F 1/136213
257/59
(Continued)

FOREIGN PATENT DOCUMENTS

CN  104483790 A  4/2015
CN  105652529 A  6/2016
(Continued)

*Primary Examiner* — Shan Liu
(74) *Attorney, Agent, or Firm* — Hemisphere Law, PLLC; Zhigang Ma

(57) ABSTRACT

The disclosure provides the COA-type array substrate, which is realized by all or part of the outer edge of the color-resisting units are located on the first metal layer and/or the second metal layer, which is used for padding to reduce the topography difference at the outer edge position of the color-resisting units, so that the thickness of the photoresist coated on which is reduced to be easily removed by the exposure and development when the transparent conductive layer is patterned; in addition, both the first metal layer and the second metal layer have a reflective property, so that the exposure effect can be enhanced and the photoresist coated on which; the COA-type array substrate of the disclosure can eliminate or reduce the metal oxide residue at
(Continued)

which through the above two effects and prevent the electrical signal of the pixel electrode from being uncontrollable.

6 Claims, 9 Drawing Sheets

(51) Int. Cl.
*G02F 1/1362* (2006.01)
*H01L 27/12* (2006.01)
*G02F 1/1337* (2006.01)

(52) U.S. Cl.
CPC ...... *G02F 1/136286* (2013.01); *H01L 27/124* (2013.01); *G02F 1/133707* (2013.01); *G02F 2001/136218* (2013.01); *G02F 2001/136222* (2013.01); *G02F 2201/121* (2013.01); *G02F 2201/123* (2013.01)

(58) Field of Classification Search
CPC ......... G02F 2201/121; G02F 2201/123; G02F 1/0316; G02F 1/133707; G02F 1/1343; G02F 1/134327; G02F 1/134363; G02F 1/13439; G02F 1/136; G02F 1/1393; G02F 1/1395; G02F 1/155; G02F 1/218; G02F 2001/134318; G02F 2001/134345; G02F 2001/134372; G02F 2001/134381; G02F 2001/1357; G02F 2001/13629; G02F 2001/136295; G02F 2001/1552; G02F 2001/1555; G02F 2001/1557; G02F 2201/12; G02F 2201/122; G02F 2201/124; G02F 2201/14; G02F 2202/10; G02F 1/1362; G02F 1/136209; G02F 1/136227; G02F 1/1365; G02F 1/1368; G02F 2001/136218; G02F 2001/136222; G02F 2001/136231; G02F 2001/13625; G02F 2001/1635; G02F 1/13473; G02F 1/133371; H01L 23/49534; H01L 27/124; H01L 27/3276; H01L 27/3279; H01L 27/329; H01L 27/3297; H01L 2933/0016; H01L 2021/775; H01L 27/1214; H01L 27/2436; H01L 29/66037; H01L 29/66068; H01L 29/66227; H01L 29/72; H01L 29/786; H01L 2924/1304; H01L 51/0504; H01L 51/0508; G09G 2300/0421; G09G 2300/0426; G09G 2300/0439; G09G 3/3659; H01J 11/44; H01J 2211/444; H01J 2329/323; H01J 29/327
USPC ...................... 349/106–111, 139–148, 42–43
See application file for complete search history.

(56) References Cited

U.S. PATENT DOCUMENTS

| | | | |
|---|---|---|---|
| 2007/0057257 A1* | 3/2007 | Kim | G02F 1/134336 257/59 |
| 2007/0182888 A1 | 8/2007 | Inoue et al. | |
| 2007/0182901 A1* | 8/2007 | Wang | G02F 1/134363 349/129 |
| 2010/0165266 A1* | 7/2010 | Sakata | B29D 11/00634 349/106 |
| 2014/0049717 A1* | 2/2014 | Kwak | G02F 1/133512 349/43 |
| 2015/0042939 A1* | 2/2015 | Park | G02F 1/134336 349/144 |
| 2015/0103281 A1* | 4/2015 | Shin | G02F 1/13624 349/38 |
| 2016/0026051 A1* | 1/2016 | Sasaki | G02F 1/133345 349/43 |
| 2016/0178961 A1* | 6/2016 | No | G02F 1/133512 349/106 |
| 2016/0202582 A1* | 7/2016 | Paek | G02F 1/136209 349/43 |
| 2017/0242306 A1* | 8/2017 | Chang | G02F 1/134309 |

FOREIGN PATENT DOCUMENTS

| | | |
|---|---|---|
| CN | 107329339 A | 11/2017 |
| CN | 107490912 A | 12/2017 |
| CN | 107490914 A | 12/2017 |

* cited by examiner

COA-TYPE ARRAY SUBSTRATE

RELATED APPLICATIONS

The present application is a National Phase of International Application Number PCT/CN2018/072512, filed on Jan. 12, 2018, and claims the priority of China Application No. 201711484164.6, filed on Dec. 29, 2017.

FIELD OF THE DISCLOSURE

The disclosure relates to a display technical field, and more particularly to a COA-type array substrate.

BACKGROUND

Liquid crystal displays (LCDs) have many advantages such as thin body, low power consumption, no radiation and so on, which are widely used in mobile phones, such as personal digital assistants (PDAs), digital cameras, computer screens and notebook screen and so on.

Most liquid crystal display devices on the market are backlight-type liquid crystal display devices, which include a housing, a liquid crystal panel disposed in the housing, and a backlight module disposed in the housing. A structure of a traditional liquid crystal panel is composed of a color-resisting substrate, a thin film transistor array substrate (TFT Array Substrate), and a liquid crystal layer disposed between the two substrates which a working principle is that a driving voltage is applied on the two substrates to control a rotation of liquid crystal molecules of a liquid crystal layer, and a light of the backlight module is refracted to generate a picture.

A COA (Color-resisting on Array) technology is a technology for preparing a color-resisting layer on an array substrate to form the COA-type array substrate. Since an alignment problem of the color-resisting substrate and the thin film transistor array substrate does not exist in the liquid crystal display panel of a COA structure, a difficulty of process of manufacturing the liquid crystal display panel during the manufacturing process of the liquid crystal display panel can be reduced, be avoided errors when manufacturing, and then improve a production yield, improve a panel quality.

The patterned electrode in the COA-type array substrate mainly comprises a first metal layer (M1), a second metal layer (M2), and a transparent conductive layer (ITO) between the separate electrode patterns in the same layer; usually, it is necessary to maintain a safe distance to prevent shorts, which are typically about 5 μm depending on the size resolution, and so on, however, even with some technical measures, problems of patterning electrode residue issues often occur in existing COA-type array substrates, which is more common in the transparent conductive layer (ITO).

FIG. 1 is a schematic cross-sectional view of a current COA-type array substrate, FIG. 2 is a schematic view of the relative position between a transparent conductive layer and a color-resisting layer in the horizontal direction in the current COA-type array substrate, FIG. 3 is a schematic top view of the current COA-type array substrate; as shown in FIG. 1 to FIG. 3, the COA-type array substrate, comprises a substrate 100, a TFT layer 200 disposed on the substrate 100, a color-resisting layer 300 disposed on the TFT layer 200, and a transparent conductive layer 400 disposed on the color-resisting layer 300; the transparent conductive layer 400 comprises a plurality of pixel electrodes 410 set at intervals and arranged in an array, a first light-shielding common electrode 420 located in an interval area 500 of the plurality of the pixel electrodes 410 without connected to the plurality of the pixel electrodes 410; after the COA-type array substrate and a CF substrate having an entire surface of the common electrode align to form a liquid crystal panels, when the liquid crystal panel displays a screen, a potential of the first light-shielding common electrode 420 is the same as the potential of the entire surface of the common electrode on the CF substrate; therefore, a voltage across the liquid crystal molecules at the position of the first light-shielding common electrode 420 is zero, so that the liquid crystal molecules in the area do not rotate, the area remains dark and a light leakage of the interval area 500 of the pixel is avoided.

The interval area 500 between the plurality of pixel electrodes 410 comprises a plurality of horizontal interval areas 510 and a plurality of vertical interval areas 520 arranged in vertical cross, the first light-shielding common electrode 420 comprises a plurality of transverse electrodes 4210 and a plurality of longitudinal electrodes 4220 arranged in vertical cross, the plurality of transverse electrodes 4210 are respectively located in the plurality of horizontal interval areas 510, the plurality of longitudinal electrodes 4220 are respectively located in a plurality of vertical interval areas 520.

The color-resisting layer 300 comprises a plurality of color-resisting units 310 set at intervals, the plurality of color-resisting units 310 respectively correspond to a top and bottom sides of a plurality of pixel electrodes respectively, and outer edges of the plurality of color-resisting units 310 extends beyond the outer edges of the plurality of pixel electrodes 410; due to a large thickness of the color-resisting units 310, a large difference in a topography easily occurs at the position corresponding to the outer edge of the color-resisting units 310 on the COA-type array substrate; therefore, when the transparent conductive layer 400 of a metal oxide material is formed on the color-resisting layer 300, a photoresist easily deposits a thick film at the position corresponding to the outer edge of the color-resisting units 310, which can not be removed by an exposure and development (that is, incomplete exposure), resulting in the metal oxide under the photoresist can not be removed by etching, finally, a metal oxide residue line 600 appears on the side of the pixel electrode 410, when the metal oxide residue line 600 connects to the transverse electrode 4210 in the pixel electrode 410 and the transverse electrode 4210 in the first light shielding common electrode 420, an electrical signal of the pixel electrode 410 may not be controlled.

As shown in FIG. 3, the TFT layer 200 comprises a first metal layer 2130, the first metal layer 2130 comprises the first metal layer 2130 comprises the frame-shaped electrode 21310 disposed along a periphery of the pixel electrode 410, and the frame-shaped electrode 21310 is disposed on the inner side of the color-resisting units 310, that is, the outer edge of the color-resisting units 310 extends beyond the outer edge of the frame-shaped electrode 21310, as a result, a Taper angle of the outer edge of the color-resisting units 310 is increased, so that the metal oxide remains on the outer edge of the color-resisting units 310 more seriously; therefore, it is necessary to adopt a method to solve a technical problem.

SUMMARY

A purpose of a present disclosure is to provide a COA-type array substrate in which an electric signal of a pixel electrode can not be controlled.

To realize an above purpose, the present disclosure provides the COA-type array substrate which comprises a substrate, a TFT layer disposed on the substrate, a color-resisting layer disposed on the TFT layer, and a transparent conductive layer disposed on the color-resisting layer.

The transparent conductive layer comprises a plurality of pixel electrodes set at intervals and arranged in an array, a first light-shielding common electrode located in an interval area of the plurality of the pixel electrodes without connected to the plurality of the pixel electrodes.

The color-resisting layer comprises a plurality of color-resisting units set at intervals, the plurality of color-resisting units respectively correspond to a top and bottom sides of a plurality of pixel electrodes, and outer edges of the plurality of color-resisting units extends beyond the outer edges of the plurality of pixel electrodes respectively.

The TFT layer comprises a first metal layer disposed on the substrate, a gate insulating layer disposed on the first metal layer, an active layer disposed on the gate insulating layer, a second metal layer on the active layer, and a passivation layer on the second metal layer; the first metal layer comprises a gate, a scan line and a second light-shielding common electrode; the second metal layer comprises a source, a drain and a data line; and the second light-shielding common electrode comprises a frame-shaped electrode arranged along a periphery of the pixel electrode.

And all or part of the outer edges of the color-resisting units are located on the first metal layer and/or the second metal layer.

The interval area between the plurality of pixel electrodes comprises a plurality of horizontal interval areas and a plurality of vertical interval areas arranged in vertical cross, the first light-shielding common electrode comprises a plurality of transverse electrodes and a plurality of longitudinal electrodes arranged in vertical cross, the plurality of transverse electrodes are respectively located in the plurality of horizontal interval areas, the plurality of longitudinal electrodes are respectively located in a plurality of vertical interval areas.

After the COA-type array substrate and a CF substrate having an entire surface of the common electrode align to form a liquid crystal panels, when the liquid crystal panel displays a screen, a potential of the first light-shielding common electrode is the same as the potential of the entire surface of the common electrode on the CF substrate.

After the COA-type array substrate and the CF substrate having the entire surface of the common electrode align to form the liquid crystal panels, and the first light-shielding common electrode in the COA-type array substrate is electrically connected with the entire surface of the common electrode on the CF substrate.

The scan lines and the data lines are perpendicular to each other, the transverse electrodes are parallel to the data lines, the pixel electrodes and the color-resisting units are both rectangular, and the pixel electrodes and the color-resisting units have two opposite sides parallel to the data line and two opposite sides parallel to the scan line.

In a direction parallel to the scan line, a width of the color-resisting units is greater than an interval distance between two adjacent transverse electrodes.

In the direction parallel to the scan line, the outer edge of the frame-shaped electrode extends beyond the outer edge of the color-resisting units so that a part of the outer edge of the color-resisting units parallel to the scan line is located on the first metal layer.

In the direction parallel to the scan line, the frame-shaped electrode further comprises a plurality of protrusions protruding from an outer edge of the frame-shaped electrode, the protrusions adjacent to the outer edge of one side of the scan line extends beyond the outer edge of the color-resisting units so that the part of the outer edge of the color-resisting units is located at the upper part of a plurality of the protrusions on the first metal layer.

In the direction parallel to the scan line, the outer edge of the color-resisting units has a concave part, the concave part comprises a bottom edge, and the bottom edge of the concave part is located on the frame-shaped electrode, so that the outer edge of the recess portion of the color-resisting units is located on the first metal layer.

A second metal layer comprises a plurality of pad layers distributed along the outer edge of the color-resisting units in the direction parallel to the scan line, the pad layer adjacent to the outer edge of the one side of the scan line extends beyond the outer edge of the color-resisting units so that the part of the outer edge of the color-resisting units is located at the upper part of a plurality of the pad layers on the second metal layer, and the plurality of pad layers are connected to at least one of the data lines, the source and the drain, or connected to none of the data lines, the source and the drain.

The second light-shielding common electrode further comprises a first strip electrode and a second strip electrode located inside the frame-shaped electrode arranged in vertical cross, both ends of the first strip electrode are vertically connected to the inner sides of the two ends of the frame-shaped electrode parallel to the data line, respectively; both ends of the second strip electrode are perpendicularly connected to an inner side of two ends of the frame-shaped electrode parallel to the scan line, respectively.

The present disclosure further provides the COA-type array substrate which comprises the substrate, the TFT layer disposed on the substrate, the color-resisting layer disposed on the TFT layer, and the transparent conductive layer disposed on the color-resisting layer.

The transparent conductive layer comprises the plurality of pixel electrodes set at intervals and arranged in the array, the first light-shielding common electrode located in the interval area of the plurality of the pixel electrodes without connected to the plurality of the pixel electrodes;

The color-resisting layer comprises the plurality of color-resisting units of the internal setting, the plurality of color-resisting units respectively correspond to the top and bottom sides of the plurality of pixel electrodes, and the outer edge of the plurality of color-resisting units extends beyond the outer edges of the plurality of pixel electrodes respectively.

The TFT layer comprises the first metal layer disposed on the substrate, the gate insulating layer disposed on the first metal layer, and an active layer disposed on the gate insulating layer, the second metal layer on the active layer, and the passivation layer on the second metal layer; the first metal layer comprises the gate, the scan line and the second light-shielding common electrode, the second metal layer comprises the source, the drain and the data line; and the second light-shielding common electrode comprises the frame-shaped electrode arranged along a periphery of the pixel electrode.

All or part of the outer edge of the color-resisting units are located on the first metal layer and/or the second metal layer.

Wherein, the interval area between the plurality of pixel electrodes comprises the plurality of horizontal interval areas and the plurality of vertical interval areas arranged in vertical cross, the first light-shielding common electrode comprises the plurality of transverse electrodes and the plurality of longitudinal electrodes arranged in vertical cross, the plurality of transverse electrodes are respectively located in the plurality of horizontal interval areas, the plurality of longitudinal electrodes are respectively located in the plurality of vertical interval areas.

After the COA-type array substrate and the CF substrate having the entire surface of the common electrode align to form the liquid crystal panels, when the liquid crystal panel displays the screen, the potential of the first light-shielding common electrode is the same as the potential of the entire surface of the common electrode on the CF substrate.

Wherein, after the COA-type array substrate and the CF substrate having the entire surface of the common electrode align to form the liquid crystal panels, and the first light-shielding common electrode in the COA-type array substrate is electrically connected with the entire surface of the common electrode on the CF substrate.

Wherein, the scan lines and the data lines are perpendicular to each other, the transverse electrodes are parallel to the data lines, the pixel electrodes and the color-resisting units are both rectangular, and the pixel electrodes and the color-resisting units have two opposite sides parallel to the data line and two opposite sides parallel to the scan line.

Wherein, in the direction parallel to the scan line, the width of the color-resisting units is greater than the interval distance between two adjacent transverse electrodes.

The beneficial effects of the present disclosure: the COA-type array substrate can be realized by all or part of the outer edge of the color-resisting units are located on the first metal layer and/or the second metal layer, on the one hand, the first metal layer and/or the second metal layer can be used for padding to reduce the topography difference of the COA-type array substrate at the outer edge position of the color-resisting units, so that the thickness of the photoresist coated on the outer edge of the color-resisting units can be reduced so as to be easily removed by the exposure and development when the transparent conductive layer is patterned; in addition, both the first metal layer and the second metal layer have a reflective property, so that the exposure effect can be enhanced and the photoresist coated on the outer edge of the color-resisting units is sufficiently exposed and removed by development; the COA-type array substrate of the present disclosure can eliminate or reduce the metal oxide residue at the outer edge of the color-resisting units through the above two effects and prevent the electrical signal of the pixel electrode from being uncontrollable.

For further understanding of the features and technical contents of the present disclosure, reference should be made to the following detailed description and accompanying figures of the present disclosure; however, the figures are for reference only and are not intended to limit the present disclosure.

BRIEF DESCRIPTION OF THE DRAWINGS

The technical solutions of the present disclosure and other beneficial effects will be apparent from the following detailed description of specific embodiments of the present disclosure with reference to the accompanying figures.

In figures.

DETAILED DESCRIPTION OF PREFERRED EMBODIMENTS

Figure 1:
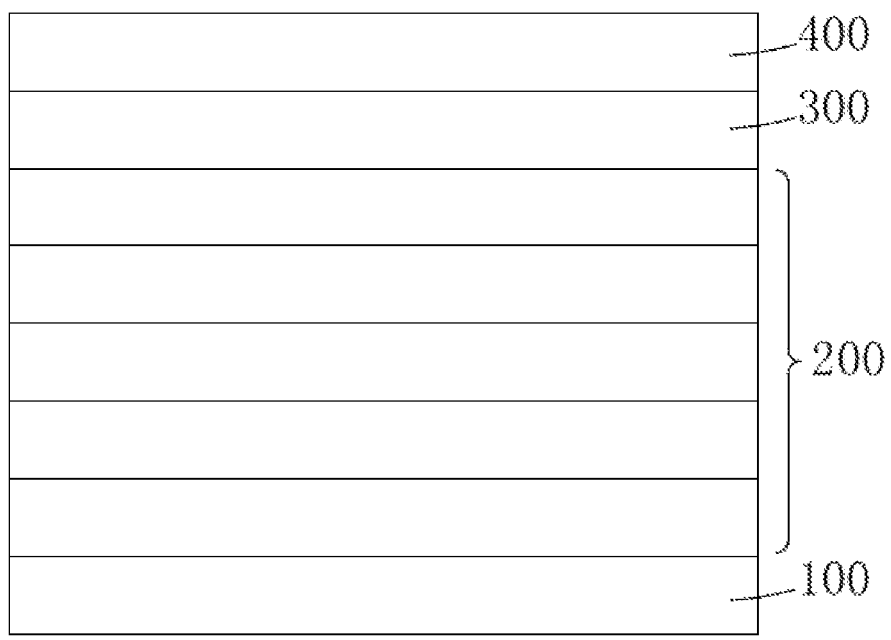
FIG. 1 is a schematic view of a vertical position of each structural layer in a current COA-type array substrate.
Figure 2:
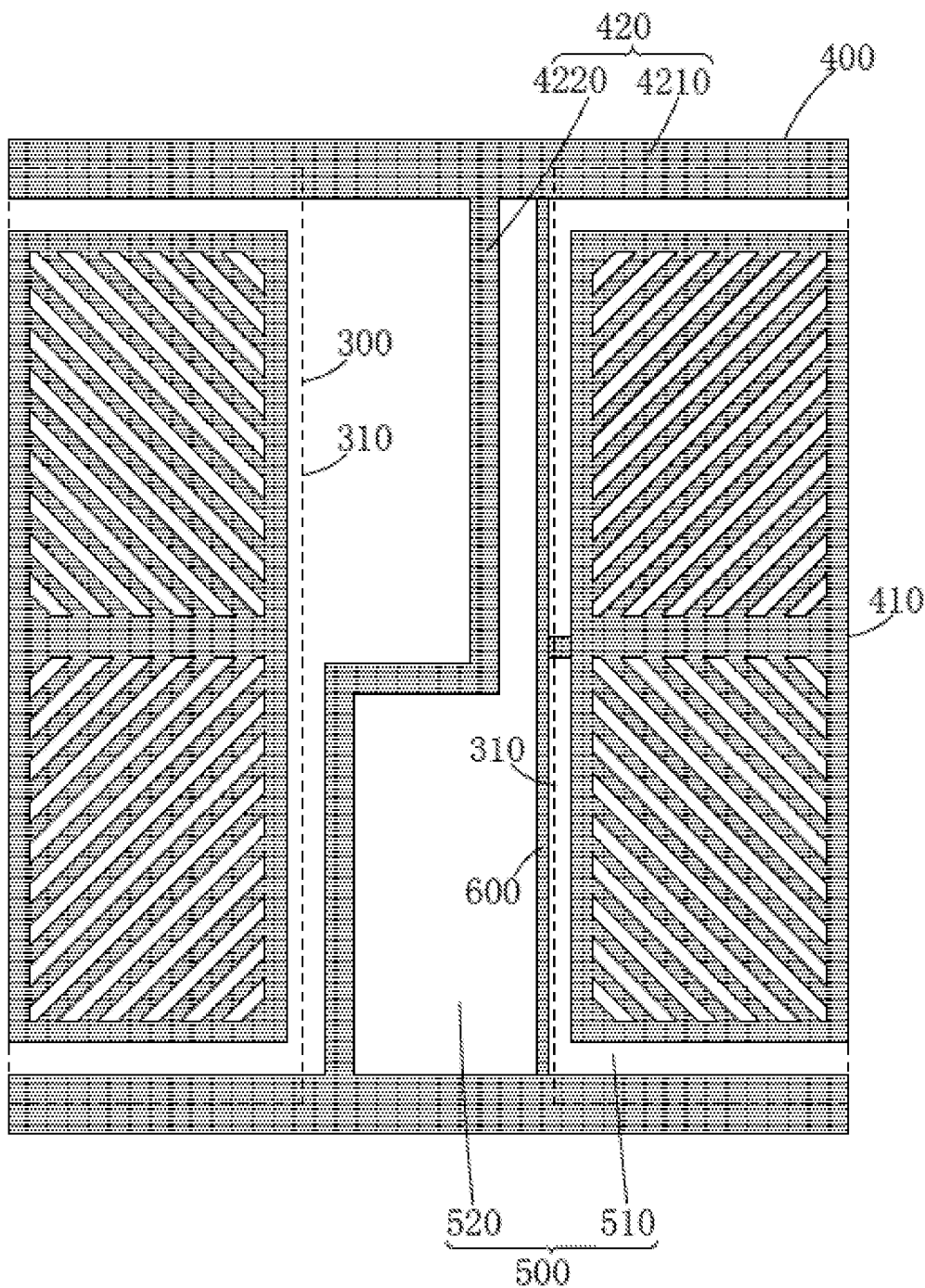
FIG. 2 is a schematic view of a relative position between a transparent conductive layer and a color-resisting layer in a horizontal direction in a current COA-type array substrate.
Figure 3:
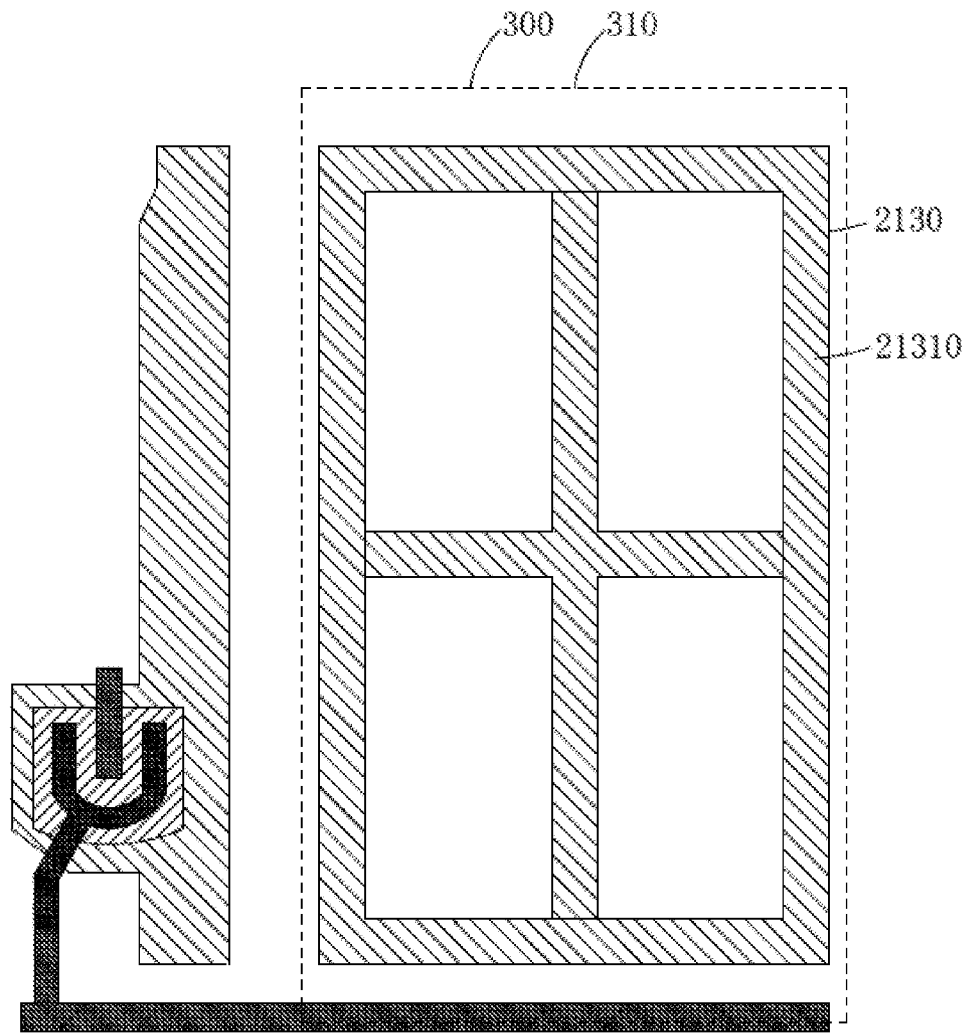
FIG. 3 is a schematic top view of a current COA-type array substrate.

To further illustrate the technical means adopted by a present disclosure and the effects thereof, the following describes the preferred embodiments of the present disclosure and the accompanying figures in detail.

As shown in FIG. 4 to FIG. 9, the present disclosure provides a COA-type array substrate, comprises a substrate 10, a TFT layer 20 disposed on the substrate 10, a color-resisting layer 30 disposed on the TFT layer 10, and a transparent conductive layer 40 disposed on the color-resisting layer 30;

The transparent conductive layer 40 comprises a plurality of pixel electrodes 41 set at intervals and arranged in an array, a first light-shielding common electrode 42 located in an interval area 50 of the plurality of the pixel electrodes 41 and not connected to the plurality of the pixel electrodes 41;

The color-resisting layer 30 comprises a plurality of color-resisting units 31 set at intervals, the plurality of color-resisting units 31 correspond to a top and bottom sides of a plurality of pixel electrodes 41 respectively, and an outer edge of the plurality of color-resisting units 31 extends beyond the outer edges of the plurality of pixel electrodes 41 respectively;

The TFT layer 20 comprises a first metal layer 21 disposed on the substrate 10, a gate insulating layer 22 disposed on the first metal layer 21, and an active layer 23 disposed on the gate insulating layer 22, a second metal layer 24 on the active layer 23, and a passivation layer 25 on the second metal layer 24; the first metal layer 21 comprises a gate 211, a scan line 212 and a second light-shielding metal 213, the second metal layer comprises a source 241, a drain 242 and a data line 243; and the second light-shielding metal 213 comprises a frame-shaped electrode 2131 arranged along a periphery of the pixel electrode 41; and the frame-shaped electrode 2131 is used to shield a display defect and a light leakage in the periphery of the pixel electrode 41.

All or part of the outer edge of the color-resisting units 31 are located on the first metal layer 21 and/or the second metal layer 24, on the one hand, the first metal layer 21 and/or the second metal layer 24 can be used for padding to reduce the topography difference of the COA array substrate at the outer edge position of the color-resisting units 31, so that the thickness of the photoresist coated on the outer edge of the color-resisting units 31 can be reduced so as to be easily removed by the exposure and development when the transparent conductive layer 40 is patterned; in addition, both the first metal layer 21 and the second metal layer 24 have a reflective property, so that the exposure effect can be enhanced and the photoresist coated on the outer edge of the color-resisting units 31 is sufficiently exposed and removed by development; the COA-type array substrate of the present disclosure can eliminate or reduce a residual of the metal oxide at the outer edge of the color-resisting units 31 through the above two effects and prevent the electrical signal of the pixel electrode from being uncontrollable.

Figure 4:
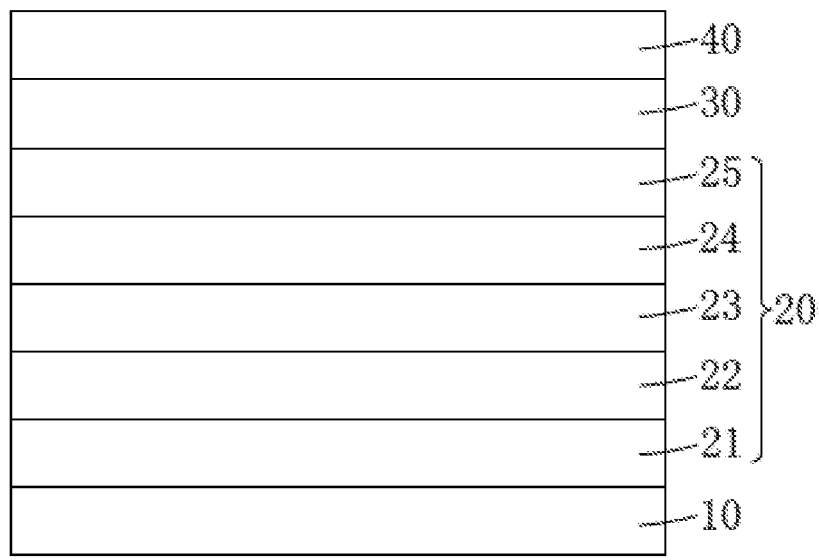
FIG. 4 is a schematic view of an upper and lower position of each structural layer in a COA-type array substrate of the present disclosure.
Figure 5:
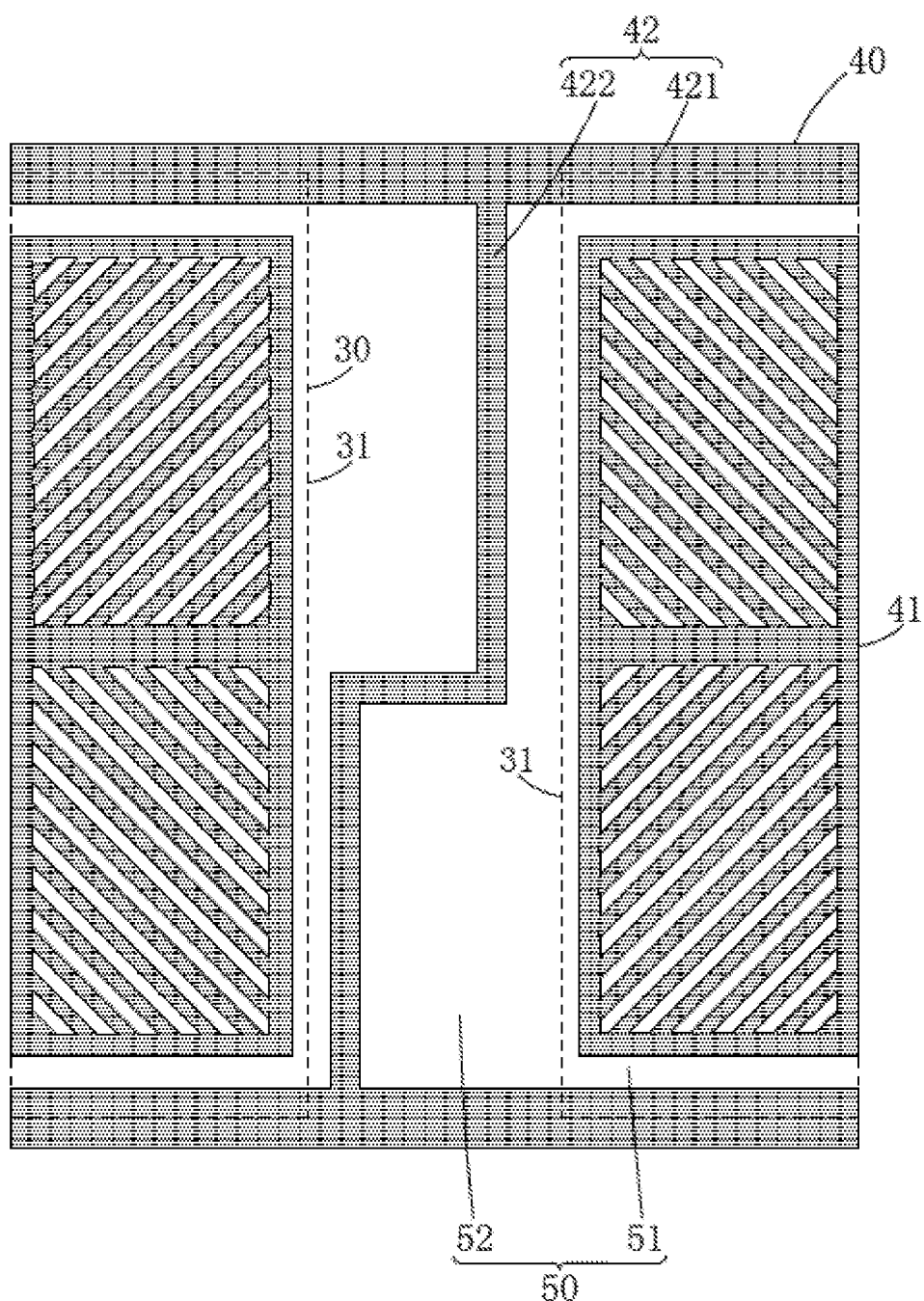
FIG. 5 is a schematic view of a relative position between a transparent conductive layer and a color-resisting layer in a horizontal direction in a COA-type array substrate of the present disclosure.

FIG. 4 only shows an upper and lower position of each structural layer in a COA-type array substrate, a relative positional relationship of each structural layer in the horizontal direction in the COA-type array substrate is shown in FIG. 5 to FIG. 9.

Specifically, the interval area 50 between the plurality of pixel electrodes 41 comprises a plurality of horizontal interval areas 51 and a plurality of vertical interval areas 52 arranged in vertical cross, the first light-shielding metal 42 comprises a plurality of transverse electrodes 421 and a plurality of longitudinal electrodes 422 arranged in vertical cross, the plurality of transverse electrodes are respectively located in the plurality of horizontal interval areas, the plurality 421 of longitudinal electrodes 422 are respectively located in a plurality of vertical interval areas 52;

After the COA-type array substrate and a CF substrate having an entire surface of the common electrode align to form a liquid crystal panels, when the liquid crystal panel displays a screen, a potential of the first light-shielding metal 42 is the same as the potential of the entire surface of the common electrode on the CF substrate; therefore, a voltage across the liquid crystal molecules at the position of the first light-shielding metal 42 is zero, so that the liquid crystal molecules in the area do not rotate, the area remains dark and a light leakage of the interval area 50 of the pixel is avoided.

Specifically, after the COA-type array substrate and the CF substrate having the entire surface of the common electrode align to form the liquid crystal panels, and the first light-shielding metal 42 in the COA-type array substrate is electrically connected with the entire surface of the common electrode on the CF substrate.

Specifically, the scan lines 212 and the data lines 243 are perpendicular to each other, the transverse electrodes 421 are parallel to the data lines 243, the pixel electrodes 41 and the color-resisting units 31 are both rectangular, and the pixel electrodes 41 and the color-resisting units 31 have two opposite sides parallel to the data line 243 and two opposite sides parallel to the scan line 212.

Specifically, a material of the transparent conductive layer 40 comprises a metal oxide, and the metal oxide is preferably indium tin oxide (ITO).

Specifically, in a direction parallel to the scan line 212, a width of the color-resisting units 31 is greater than an interval distance between two adjacent transverse electrodes 421, that is, the interval area between the horizontal electrode 421 and the pixel electrode 41 is located on a flat area of the color-resisting units 31; therefore, in a photolithography process for fabricating the transparent conductive layer 40, a metal oxide residue does not easily occur between the transverse electrode 421 and the pixel electrode 41. Therefore, it is not necessary to adjust the relative positions of the color-resisting units 31, the first metal layer 21 and the second metal layer 24 in the direction parallel to the transverse electrode 421.

Specifically, a function of the longitudinal electrode 422 is not to shield the light but to connect several transverse electrodes 421 arranged in parallel, and the liquid crystal display panel needs to be provided with a black matrix for light shielding at the position of the longitudinal electrode 422, and a shape of the longitudinal electrode 422 is non-linear, which avoids an interference with other electrodes and avoids a signal interference with other electrodes.

Specifically, the width of the transverse electrode 421 is greater than the width of the longitudinal electrode 422, and the width of the transverse electrode 421 is linear and has a relatively large width so that the light shielding effect is better, and the liquid crystal display panel does not need to be provided with a black matrix at the location of the transverse electrode 421.

Specifically, the transverse electrode 421 is disposed above the scan line 212 of the TFT layer 20.

Specifically, the thickness of each of the first metal layer 21 and the second metal layer 24 is 0.2-0.7 μm. In the present disclosure, the position of the outer edge of the color-resisting units 31 is lifted by using one or two 0.2-0.7 μm metal layers, which can reduce the topography difference of the COA-type array substrate at the outer edge position of the color-resisting units, and eliminate or reduce the metal oxide residue at the outer edge of the color-resisting units 31.

Preferably, the first metal layer 21 comprises an aluminum (Al) film and a molybdenum (Mo) film stacked together, and the thickness of the first metal layer 21 is 0.39 μm; alternatively, the first metal layer 21 includes a copper (Cu) film and the molybdenum film stacked together, and the thickness of the first metal layer 21 is 0.55 μm.

Preferably, the first metal layer 21 comprises the aluminum film and the molybdenum film stacked together, and the thickness of the first metal layer 21 is 0.39 μm; alternatively, the first metal layer 21 includes the copper film and the molybdenum film stacked together, and the thickness of the first metal layer 21 is 0.55 μm.

Figure 6:
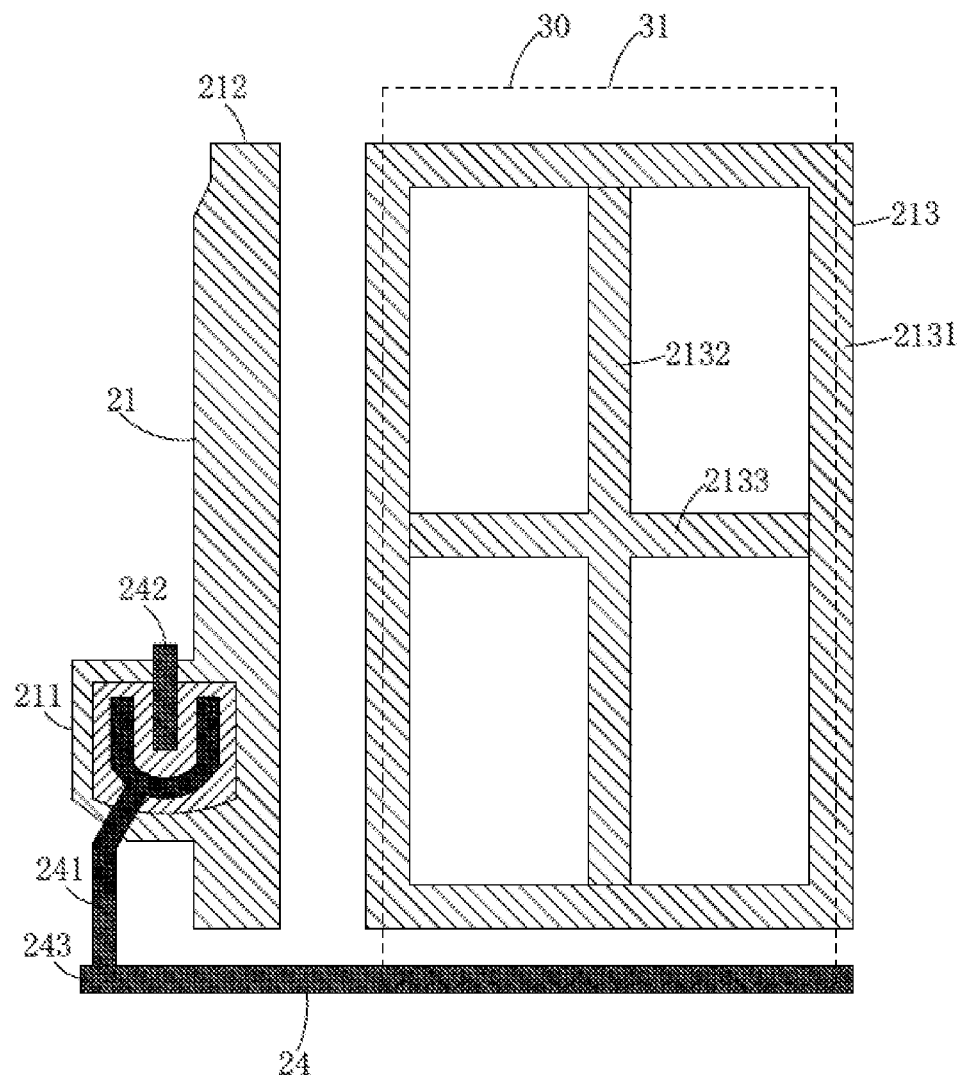
FIG. 6 is a schematic top view of a first embodiment of a COA-type array substrate of the present disclosure.

See FIG. 6, which is a first embodiment of the COA-type array substrate of the present disclosure, in the first embodiment, in the direction parallel to the scan line 212, the outer edge of the frame-shaped electrode 2131 extends beyond the outer edge of the color-resisting units 31 so that a part of the outer edge of the color-resisting units 31 parallel to the scan line 212 is located on the first metal layer 21. An implementation of the technical means can be: the position of the color-resisting units 31 is unchanged, and the outer edge of the frame-shaped electrode 2131 extends beyond the outer edge of the color-resisting units 31, so that a mask of the first metal layer 21 needs to be changed; the implementation of the technical means can also be: the position of the frame-shaped electrode 2131 is unchanged, and the outer edge of the color-resisting units 31 is retreated to the inner side of the frame-shaped electrode 2131, so that the mask of the color-resisting layer 30 needs to be changed; the technical solution can avoid the metal oxide residue at the outer edge of the color-resisting units 31 and avoid the situation that the electrical signal of the pixel electrode can not be controlled. The change of the first metal layer 21 or the color-resisting layer 30 is premised on the electrical properties that do not significantly affect an aperture ratio (AR) and a parasitic capacitance.

Specifically, the distance between the outer edge of the frame-shaped electrode 2131 exceeding the outer edge of the color-resisting units 31 is 1-2 μm.

Specifically, in the first embodiment, the outer edge of the color-resisting units 31 may also be located on the second metal layer 24, that is, the second metal layer 24 is formed above the frame-shaped electrode 2131 corresponding to the first metal layer 21, and an overlap of the first metal layer 21 and the second metal layer 24 can greatly minimize the topography difference of the outer edge of color-resisting units 31.

Figure 7:
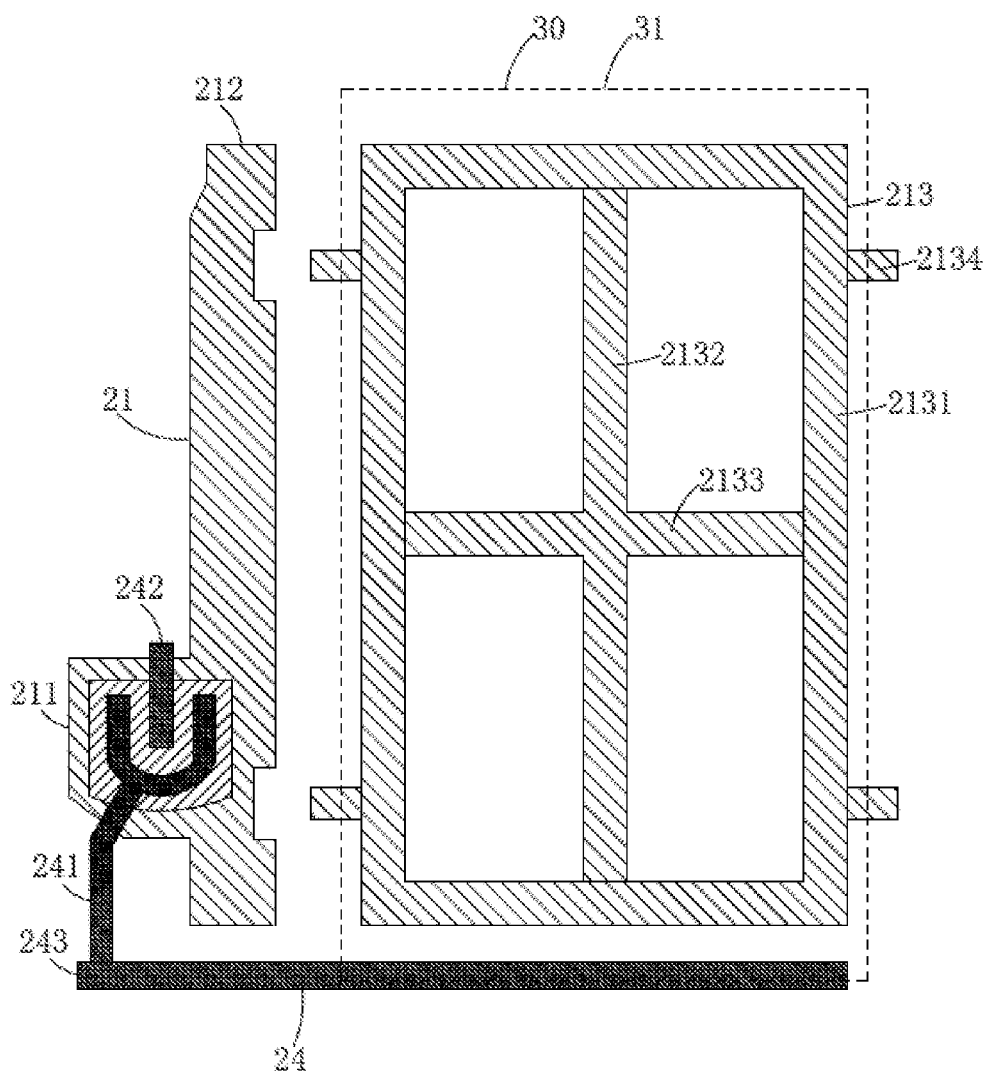
FIG. 7 is a schematic top view of a second embodiment of a COA-type array substrate of the present disclosure.

See FIG. 7, which is a second embodiment of the COA-type array substrate of the present disclosure, in the second embodiment, in the direction parallel to the scan line 212, the frame-shaped electrode 2131 further comprises a plurality of protrusions 2134 protruding from an outer edge of the frame-shaped electrode 2131, the protrusions 2134 adjacent to the outer edge of a one side of the scan line 212 extends beyond the outer edge of the color-resisting units 31 so that the part of the outer edge of the color-resisting units 31 is located on the upper part of a plurality of the protrusions 2134 on the first metal layer 21. The implementation of the technical means can be: the position of the color-resisting units 31 is unchanged, and the outer edge of the frame-shaped electrode 2131 extends beyond the outer edge of the color-resisting units 31, so that the mask of the first metal layer 21 needs to be changed. The technical solution can prevent the metal oxide from remaining on the plurality of protrusions 2134 so that a metal oxide residual line at the outer edge of the color-resisting units 31 is divided into a plurality of discrete segments, and the pixel electrode 41 and the first light-shielding metal 42 can not be connected. The change of the first metal layer 21 is premised on the electrical properties that do not significantly affect the aperture ratio (AR) and the parasitic capacitance.

Specifically, the part of the scan line 212 corresponding to the plurality of protrusions 2134 is concave, so as to ensure a safe distance.

Specifically, the distance between the protrusions 2134 on the side near the scan line 212 and the outer edge of the color-resisting units 31 is 1-2 µm.

Preferably, two protrusions 2134 are respectively distributed on two sides of the frame-shaped electrode 2131 parallel to the scan line 212, and the two protrusions 2134 are respectively located at the both ends of the side edge.

Specifically, in the second embodiment, the outer edge of the color-resisting units 31 may also be located on the second metal layer 24, that is, the second metal layer 24 is formed above the frame-shaped electrode 2131 corresponding to the first metal layer 21, and the overlap of the first metal layer 21 and the second metal layer 24 can greatly minimize the topography difference of the outer edge of color-resisting units 31.

Figure 8:
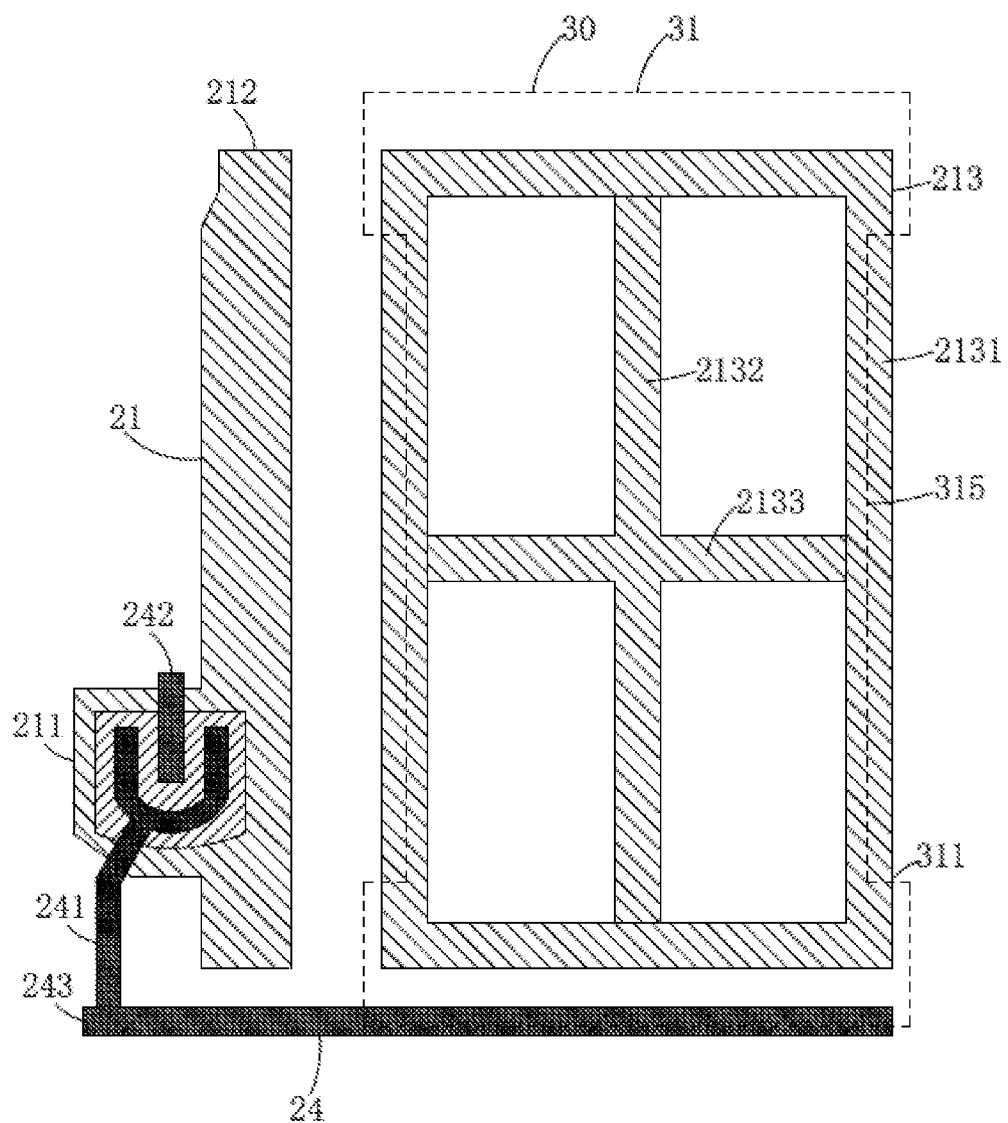
FIG. 8 is a schematic top view of a third embodiment of a COA-type array substrate of the present disclosure.

See FIG. 8, which is a third embodiment of the COA-type array substrate of the present disclosure, in the third embodiment, in the direction parallel to the scan line 212, the outer edge of the color-resisting units 31 has a concave part 311, the concave part 311 comprises a bottom edge 315, and the bottom edge 315 of the concave part 311 is located on the frame-shaped electrode 2131, so that the outer edge of the concave part of the color-resisting units 31 is located on the first metal layer 21. The implementation of the technical means can be: the position of the frame-shaped electrode 2131 is unchanged, and the part of the outer edge of the color-resisting units 31 needs to be concave, so that the mask of the color-resisting layer 30 needs to be changed. The technical solution can prevent the metal oxide from remaining on the plurality of protrusions 2134 so that the metal oxide residual line at the outer edge of the color-resisting units 31 is divided into a plurality of discrete segments, and the pixel electrode 41 and the first light-shielding metal 42 can not be connected. The change of the color-resisting layer 30 is premised on the electrical properties that do not significantly affect the aperture ratio (AR) and the parasitic capacitance.

Specifically, the distance between the outer edge of the frame-shaped electrode 2131 exceeding the bottom edge 315 of the concave part 311 is 1-2 µm.

Preferably, the concave part 311 is respectively distributed on two sides of the frame-shaped electrode 2131 parallel to the scan line 212, and two ends of the concave part 311 are respectively located at both ends of the side edge.

Preferably, in the third embodiment, the bottom edge 315 of the concave part 311 is also located on the second metal layer 24, that is, the second metal layer 24 is formed above the frame-shaped electrode 2131 corresponding to the first metal layer 21, and the overlap of the first metal layer 21 and the second metal layer 24 can greatly minimize the topography difference of the outer edge of color-resisting units 31.

Figure 9:
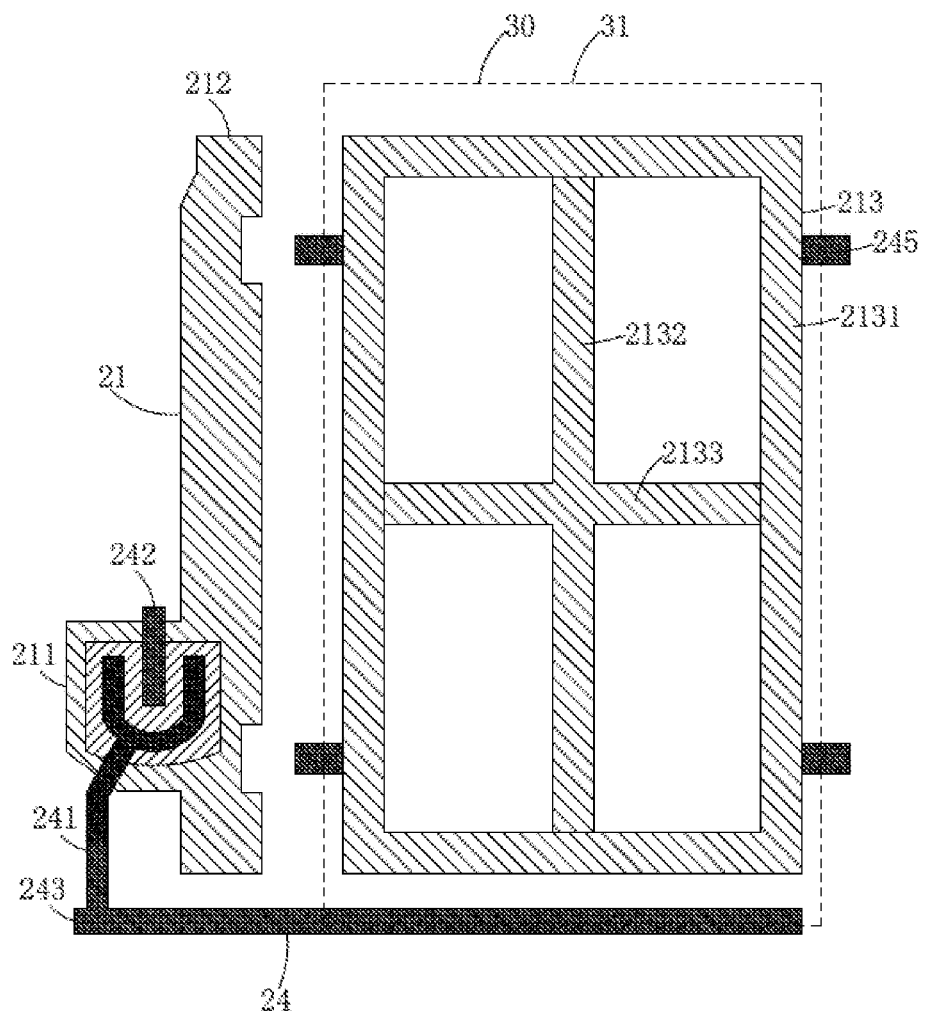
FIG. 9 is a schematic top view of a fourth embodiment of a COA-type array substrate of the present disclosure.

See FIG. 9, which is a fourth embodiment of the COA-type array substrate of the present disclosure, in the fourth embodiment, the second metal layer 24 comprises a plurality of pad layers distributed along the outer edge of the color-resisting units 31 in the direction parallel to the scan line 212, the pad layer 245 adjacent to the outer edge of the one side of the scan line 212 extends beyond the outer edge of the color-resisting units 31 so that the part of the outer edge of the color-resisting units 31 is located on the upper part of a plurality of the pad layers 245 on the second metal layer 24, and the plurality of pad layers 245 are connected to at least one of the data lines 243, the source 241 and the drain 242, or none of the data lines 243, the source 241 and the drain 242. The technical solution is realized by changing the mask of the second metal layer 24 so that the metal oxide can be prevented from remaining at the plurality of liner layers 245, so that the metal oxide residual line at the outer edge of the color-resisting units 31 is divided into a plurality of discrete segments, and the pixel electrode 41 and the first light-shielding metal 42 can not be connected. The change of the mask of the second metal layer 24 is premised on the electrical properties that do not significantly affect the aperture ratio (AR) and the parasitic capacitance.

Specifically, the distance between the pad layer 245 and the outer edge of the side near the scan line 212 exceeding the outer edge of the concave part 311 is 1-2 µm.

Preferably, two pad layers 245 are respectively distributed on two sides of the color-resisting units 31 parallel to the scan line 212, and the two pad layers 245 are respectively located at the both ends of the side edge.

Specifically, in the fourth embodiment, the outer edge of the color-resisting units 31 may also be located on the first metal layer 21, that is, the first metal layer 21 is formed above the pad layer 245 corresponding to the second metal layer 24, and the overlap of the first metal layer 21 and the second metal layer 24 can greatly minimize the topography difference of the outer edge of color-resisting units 31.

It should be noted that in addition to adjusting the relative positions of the color-resisting units 31, the first metal layer 21 and the second metal layer 24, the COA-type array substrate of the present disclosure may also be manufactured by using a half-tone mask process to form a color-resisting layer 30, so as to reduce the taper angle of the outer edge of the color-resisting units 31, and reduce or eliminate the metal oxide residue.

Specifically, the pixel electrode 41 is a "*" shaped electrode.

Specifically, the second light-shielding metal 213 further comprises a first strip electrode 2132 and a second strip electrode 2133 located inside the frame-shaped electrode 2131 arranged in vertical cross, both ends of the first strip electrode 2132 are vertically connected to the inner sides of the two ends of the frame-shaped electrode 2131 parallel to the data line 243, respectively; both ends of the second strip electrode 2133 are perpendicularly connected to an inner side of two ends of the frame-shaped electrode 2131 parallel to the scan line 212, respectively, and the first strip electrode 2132 and the second strip electrode 2133 are used for shielding the display defect and the light leakage at a cruciform keel of the pixel electrode 41.

In general, it is difficult to control an inversion of the liquid crystal molecules at the periphery of the pixel electrode 41 and the cruciform keel, when the pixel is in a bright state, the display defect is prone to occur, and when the pixel is in a dark state, light leakage is prone to occur, after the second light-shielding metal 213 is disposed at the position corresponding to the periphery of the pixel electrode 41 and the cruciform keel in the present disclosure, and the second light-blocking common electrode 213 blocks the display defect and the light leakage in the area and controls the voltage on both sides of the liquid crystal layer by means of a physical light-shielding manner, so as to prevent an abnormal display and light leakage.

Specifically, the second light-shielding metal 213 is not connected to the first light-shielding metal 42 and the entire surface of the CF substrate, the second light-shielded metal 213 is provided with a separate voltage signal by a common electrode line, which is capable of shielding a lateral electric field and is capable of controlling a turn of the liquid crystal molecules around the pixel electrode 41 and the keel to eliminate the abnormal display and light leakage and improve the display effect.

Specifically, the transparent conductive layer 40 has the thickness of about 40 nm.

Specifically, the gate insulating layer 22 and the passivation layer 25 may be a silicon nitride (SiNx) film.

In summary, the present disclosure provides the COA-type array substrate, which can be realized by all or part of the outer edge of the color-resisting units are located on the first metal layer and/or the second metal layer, on the one hand, the first metal layer and/or the second metal layer can be used for padding to reduce the topography difference of the COA-type array substrate at the outer edge position of the color-resisting units, so that the thickness of the photoresist coated on the outer edge of the color-resisting units can be reduced so as to be easily removed by the exposure and development when the transparent conductive layer is patterned; in addition, both the first metal layer and the second metal layer have a reflective property, so that the exposure effect can be enhanced and the photoresist coated on the outer edge of the color-resisting units is sufficiently exposed and removed by development; the COA-type array substrate of the present disclosure can eliminate or reduce the metal oxide residue at the outer edge of the color-resisting units through the above two effects and prevent the electrical signal of the pixel electrode from being uncontrollable.

In the foregoing, other various modifications and variations may be made by those skilled in the art according to the technical solutions and technical ideas of the present disclosure, and all such changes and modifications shall fall within the protection scope of the claims of the present disclosure.

What is claimed is:

1. A COA-type array substrate, comprising a substrate, a TFT layer disposed on the substrate, a color-resisting layer disposed on the TFT layer, and a transparent conductive layer disposed on the color-resisting layer;
    wherein the transparent conductive layer comprises a plurality of pixel electrodes set at intervals and arranged in an array, a first light-shielding common electrode located in an interval area of the plurality of pixel electrodes without connected to the plurality of pixel electrodes;
    wherein the color-resisting layer comprises a plurality of color-resisting units set at the intervals, the plurality of color-resisting units respectively correspond to a top and bottom sides of the plurality of pixel electrodes, and outer edges of the plurality of color-resisting units respectively extend beyond outer edges of the plurality of pixel electrodes;
    wherein the TFT layer comprises a first metal layer disposed on the substrate, a gate insulating layer disposed on the first metal layer, an active layer disposed on the gate insulating layer, a second metal layer on the active layer, and a passivation layer on the second metal layer; the first metal layer comprises a gate, a scan line and a second light-shielding common electrode; the second metal layer comprises a source, a drain and a data line perpendicular to the scan line; and the second light-shielding common electrode comprises a frame-shaped electrode arranged along a periphery of the pixel electrode;
    wherein all or part of the outer edges of the color-resisting units are located on the first metal layer and/or the second metal layer;
    wherein the second light-shielding common electrode further comprises a first strip electrode and a second strip electrode located inside the frame-shaped electrode and arranged in vertical cross, two ends of the first strip electrode are respectively connected to two sides of the frame-shaped electrode parallel to the data line, and two ends of the second strip electrode are respectively connected to two sides of the frame-shaped electrode parallel to the scan line;
    wherein the frame-shaped electrode comprises a plurality of protrusions protruding from at least one outer edge of the frame-shaped electrode, two of the plurality of protrusions protruding from an outer edge of the frame-shaped electrode adjacent to and parallel with the scan line are respectively arranged above and below the second strip electrode and each extends beyond an outer edge of a color-resisting unit parallel to the scan line so that parts of the outer edge of the color-resisting unit are located on upper parts of the two of plurality of protrusions on the first metal layer;
    wherein a side of the scan line adjacent to the two of the plurality of protrusions has two concaves respectively corresponding to the two of the plurality of protrusions, and the two of the plurality of protrusions are isolated from the scan line; and
    wherein another two of the plurality of protrusions protruding from another outer edge of the frame-shaped electrode away from and parallel with the scan line are respectively arranged above and below the second strip electrode and each extends beyond another outer edge of the color-resisting unit parallel to the scan line.

2. The COA-type array substrate according to claim 1, wherein the interval area between the plurality of pixel electrodes comprises a plurality of horizontal interval areas and a plurality of vertical interval areas arranged in vertical cross, the first light-shielding common electrode comprises a plurality of transverse electrodes and a plurality of longitudinal electrodes arranged in vertical cross, the plurality of transverse electrodes are respectively located in the plurality of horizontal interval areas, the plurality of longitudinal electrodes are respectively located in a plurality of vertical interval areas;

the COA-type array substrate and a CF substrate having an entire surface of a common electrode align to form a liquid crystal panel, in a case the liquid crystal panel displays a screen, a potential of the first light-shielding common electrode is the same as the potential of the entire surface of the common electrode on the CF substrate.

3. The COA-type array substrate according to claim 2, wherein the first light-shielding common electrode in the COA-type array substrate is electrically connected with the entire surface of the common electrode on the CF substrate.

4. The COA-type array substrate according to claim 1, wherein an outer edge of the frame-shaped electrode in the direction parallel to the scan line extends beyond an outer edge of the color-resisting units so that a part of the outer edge of the color-resisting units parallel to the scan line is located on the first metal layer.

5. A COA-type array substrate, comprising a substrate, a TFT layer disposed on the substrate, a color-resisting layer disposed on the TFT layer, and a transparent conductive layer disposed on the color-resisting layer;
wherein the transparent conductive layer comprises a plurality of pixel electrodes set at intervals and arranged in an array, a first light-shielding common electrode located in an interval area of the plurality of the pixel electrodes without connected to the plurality of pixel electrodes;
wherein the color-resisting layer comprises a plurality of color-resisting units set at the intervals, the plurality of color-resisting units respectively correspond to a top and bottom sides of a plurality of pixel electrodes, and outer edges of the plurality of color-resisting units extends beyond outer edge of the plurality of pixel electrodes;
wherein the TFT layer comprises a first metal layer disposed on the substrate, a gate insulating layer disposed on the first metal layer, an active layer disposed on the gate insulating layer, a second metal layer on the active layer, and a passivation layer on the second metal layer; the first metal layer comprises a gate, a scan line and a second light-shielding common electrode; the second metal layer comprises a source, a drain and a data line; and the second light-shielding common electrode comprises a frame-shaped electrode arranged along a periphery of the pixel electrode; and
wherein all or part of the outer edges of the color-resisting units are located on the first metal layer and/or the second metal layer;
wherein the interval area between the plurality of pixel electrodes comprises a plurality of horizontal interval areas and a plurality of vertical interval areas arranged in vertical cross, the first light-shielding common electrode comprises a plurality of transverse electrodes and a plurality of longitudinal electrodes arranged in vertical cross, the plurality of transverse electrodes are respectively located in the plurality of horizontal interval areas, the plurality of longitudinal electrodes are respectively located in a plurality of vertical interval areas;
wherein the COA-type array substrate and a CF substrate having an entire surface of the common electrode align to form a liquid crystal panels, in a case the liquid crystal panel displays a screen, a potential of the first light-shielding common electrode is the same as the potential of the entire surface of the common electrode on the CF substrate;
wherein the first light-shielding common electrode in the COA-type array substrate is electrically connected with the entire surface of the common electrode on the CF substrate;
wherein the scan line and the data line are perpendicular to each other, the transverse electrodes are parallel to the data line, the pixel electrodes and the color-resisting units are both rectangular, and the pixel electrodes and the color-resisting units have two opposite sides parallel to the data line and two opposite sides parallel to the scan line;
wherein in a direction parallel to the scan line, a width of the color-resisting units is greater than an interval distance between two adjacent transverse electrodes;
wherein the second light-shielding common electrode further comprises a first strip electrode and a second strip electrode located inside the frame-shaped electrode and arranged in vertical cross, two ends of the first strip electrode are respectively connected to two sides of the frame-shaped electrode parallel to the data line, and two ends of the second strip electrode are respectively connected to two sides of the frame-shaped electrode parallel to the scan line;
wherein the frame-shaped electrode comprises a plurality of protrusions protruding from at least one outer edge of the frame-shaped electrode, two of the plurality of protrusions protruding from an outer edge of the frame-shaped electrode adjacent to and parallel with the scan line are respectively located above and below the second strip electrode and each extends beyond an outer edge of a color-resisting unit parallel to the scan line so that parts of the outer edge of the color-resisting unit are located on upper parts of the two of plurality of protrusions on the first metal layer;
wherein a side of the scan line adjacent to the two of the plurality of protrusions has two concaves respectively corresponding to the two of the plurality of protrusions, and the two of the plurality of protrusions are isolated from the scan line; and
wherein another two of the plurality of protrusions protruding from another outer edge of the frame-shaped electrode away from and parallel with the scan line are respectively arranged above and below the second strip electrode and each extends beyond another outer edge of the color-resisting unit parallel to the scan line.

6. The COA-type array substrate according to claim 5, wherein an outer edge of the frame-shaped electrode in the direction parallel to the scan line extends beyond an outer edge of the color-resisting units so that a part of the outer edge of the color-resisting units parallel to the scan line is located on the first metal layer.

* * * * *